(12) United States Patent
Peng et al.

(10) Patent No.: US 8,884,797 B2
(45) Date of Patent: Nov. 11, 2014

(54) SYSTEMS AND METHODS PROVIDING ACTIVE AND PASSIVE CHARGE SHARING IN A DIGITAL TO ANALOG CONVERTER

(75) Inventors: Yung-Chow Peng, Hsinchu (TW); Jui-Cheng Huang, Hsinchu (TW); Ching-Ho Chang, Hsinchu (TW); Nang Ping Tu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 458 days.

(21) Appl. No.: 13/035,444

(22) Filed: Feb. 25, 2011

(65) Prior Publication Data

US 2012/0218235 A1  Aug. 30, 2012

(51) Int. Cl.
 *H03M 1/66* (2006.01)
 *H03M 1/68* (2006.01)
 *G09G 3/36* (2006.01)
 *H03M 1/80* (2006.01)

(52) U.S. Cl.
 CPC ............ *H03M 1/68* (2013.01); *G09G 2300/023* (2013.01); *G09G 2310/027* (2013.01); *G09G 3/3688* (2013.01); *H03M 1/804* (2013.01)
 USPC ........... 341/144; 341/161; 341/110; 341/150; 341/118; 341/155; 341/172; 341/143

(58) Field of Classification Search
 USPC ............ 341/126–172; 345/87–104, 204–215; 377/64–81; 315/169.2; 340/12.21
 See application file for complete search history.

(56) References Cited

U.S. PATENT DOCUMENTS

| | | | | |
|---|---|---|---|---|
| 4,872,011 A | * | 10/1989 | Pelgrom et al. | 341/150 |
| 5,294,927 A | * | 3/1994 | Levinson et al. | 341/141 |
| 7,598,894 B2 | * | 10/2009 | Chang | 341/144 |
| 2006/0114142 A1 | * | 6/2006 | Ohmi et al. | 341/155 |
| 2010/0164761 A1 | * | 7/2010 | Wan et al. | 341/108 |

OTHER PUBLICATIONS

H. N. Nguyen, A Multi-bit/cycle 12-bit Cycle DAC for TFT-LCD Column Drivers, 2008, Information and Communications University, pp. 263-266.*
H.N.Nguyen, A multi-bit/cycle 12-bit Cycle DAC for TFT-LCD Column Drives, 2008, Information and Communication University, pp. 263-266.*
H. N. Nguyen et al., "A Multi-bit/Cycle 12-bit Cyclic DAC for TFT-LCD Column Drivers", IDW 2008, pp. 263-266.

* cited by examiner

*Primary Examiner* — Alexander S Beck
*Assistant Examiner* — Amen Bogale
(74) *Attorney, Agent, or Firm* — Haynes and Boone, LLP (57) ABSTRACT

A method for converting a multi-bit digital value to an analog value. The method includes, in a first conversion cycle, converting a first set of digital bits to a first analog voltage using passive charge-sharing. The method also includes, in a second conversion cycle, converting a second set of digital bits to a second analog voltage added to the first analog voltage using active charge-sharing. The first set of digital bits and the second set of digital bits are different bits of the multi-bit digital value.

17 Claims, 9 Drawing Sheets

SYSTEMS AND METHODS PROVIDING ACTIVE AND PASSIVE CHARGE SHARING IN A DIGITAL TO ANALOG CONVERTER

BACKGROUND

The present disclosure relates generally to Digital to Analog Converters (DACs). Specifically, the present disclosure relates to systems and methods that provide both active charge-sharing and passive charge-sharing in a conversion operation.

Most Liquid Crystal Display (LCD) panels include an array of pixels that are driven by signals on rows and columns to address the individual pixels. An example column driver includes a multitude of DACs that receive video signals as digital bits and output analog signals that can be applied to the pixels to render a desired image.

An example DAC uses a passive charge-sharing technique during conversion. Passive charge-sharing conversion can provide desirable speed for some applications. However, parasitic capacitance arises in switch circuitry in passive charge-sharing devices and may lead to non-linear performance. As a result, some applications include a large-sized capacitor array, which helps with linearity but takes up more space on a semiconductor die.

Another example DAC uses an active charge-sharing technique during conversion. The active charge-sharing technique uses negative feedback at an op-amp to ensure linear operation. However, the op-amp settling time can be tight. Thus, in order to meet DAC convention timing specifications, high power consumption is used in the op-amp.

Therefore, designers of DACs in some applications have to choose between adding space on the die to accommodate passive charge-sharing or consuming large amounts of energy for active charge sharing. More efficient and effective DACs are called for.

SUMMARY

The present disclosure provides for many different embodiments. One embodiment includes a method for converting a multi-bit digital value to an analog value. The method includes, in a first conversion cycle, converting a first set of digital bits to a first analog voltage using passive charge-sharing. The method also includes, in a second conversion cycle, converting a second set of digital bits to a second analog voltage added to the first analog voltage using active charge-sharing. The first set of digital bits and the second set of digital bits are different bits of the multi-bit digital value.

In another embodiment, a DAC includes a switched capacitor array with an input that receives serialized digital bits, an amplifier in communication with an output of the switched capacitor array, and a control signal generator generating pulse-width control signals to control the switched capacitor array and the amplifier to assume one of two modes. The modes include a passive charge-sharing mode and an active charge-sharing mode.

In another embodiment an LCD panel that includes an array of DACs receiving digital video data, converting the digital video data to analog signals, and driving pixels within the LCD panel using the analog signals. Each of the DACs has an array of capacitors and an amplifier. The LCD panel also has a control signal generator producing binary control signals to control the array of capacitors and the amplifier to perform a first conversion cycle using passive charge-sharing and a second conversion cycle using active charge-sharing.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to Digital to Analog Converters (DACs). Specifically, the present disclosure relates to systems and methods that provide both active charge-sharing and passive charge-sharing in a conversion operation. While the examples herein discuss applying the techniques for signal conversion in LCD panels, the scope of embodiments is not so limited. On the contrary, the concepts described herein can be applied to any application that uses a DAC, including audio equipment, such as mp3 players, and the like.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
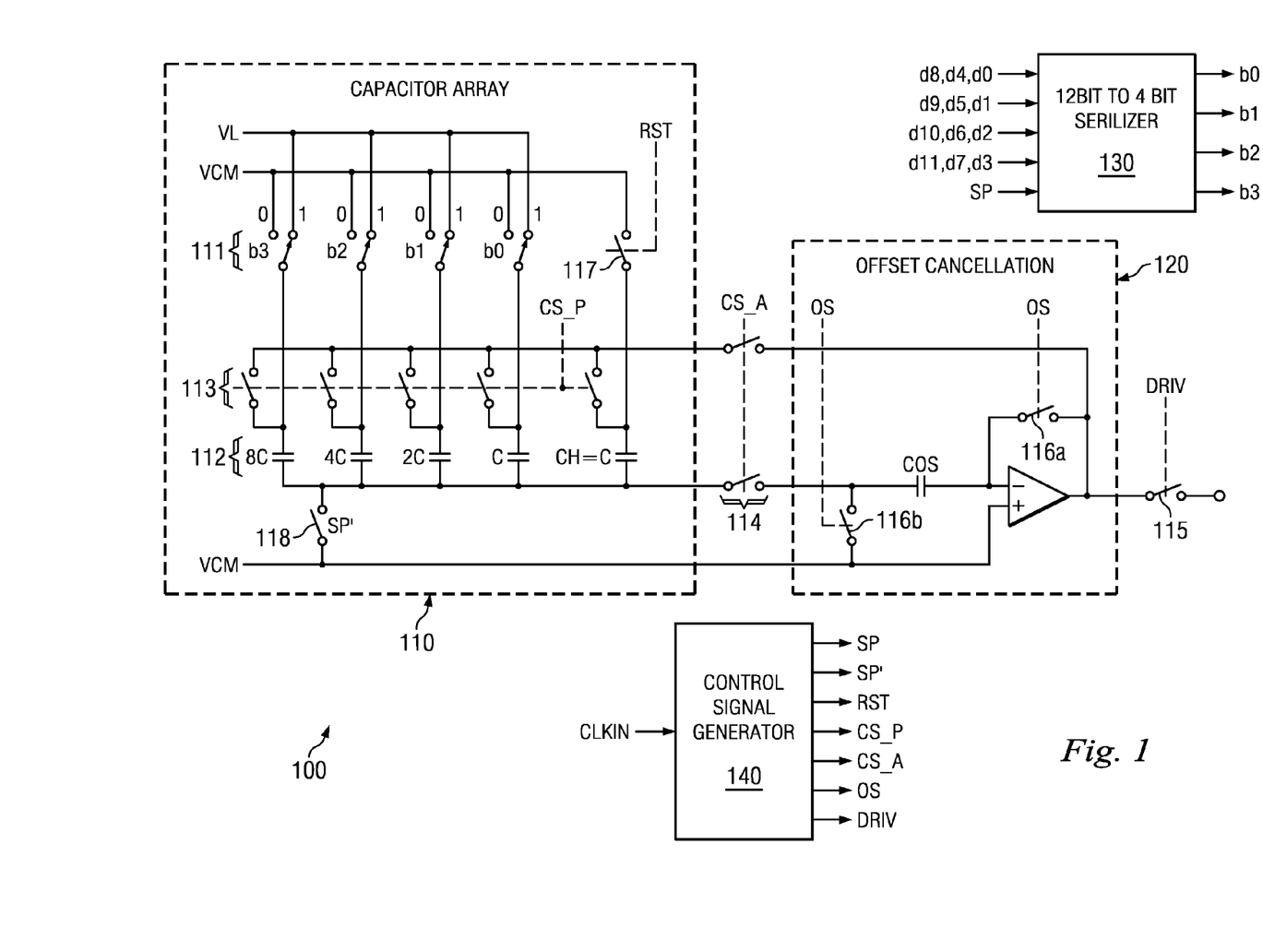
FIG. 1 is a circuit diagram of a DAC according to an exemplary embodiment.

With reference now to the figures, FIG. 1 is a circuit diagram of DAC 100 according to an exemplary embodiment. DAC 100 includes a switched capacitor array 110, an amplifier module 120 providing offset cancellation, a data serializer 130, and a control signal generator 140.

Data serializer 130 in this example receives a twelve-bit digital signal (d0-d11). Data serializer 130 then changes the twelve-bit digital signal to a four-channel (b0-b3) serial signal. The four-channel serial signal is input to capacitor array 110, where the value on each channel controls switches 111 to connect respective capacitors 112 one of the reference voltages $V_L$ and $V_{CM}$. Switches 111, or any of the other switches of FIG. 1, may be implemented using, e.g., transistors.

Control signal generator 140 receives a clock signal (CLKIN) and outputs pulse-width control signals used by DAC 100. Each of the control signals is a binary signal that opens or closes a particular switch, as shown in more detail in FIGS. 3A-3F. DAC 100 provides for conversion of the twelve-bit digital signal in three cycles of four bits each. As explained in more detail below, DAC 100 applies different charge-sharing operations to each of the cycles. For instance, in this example, DAC 100 applies a passive charge-sharing operation to the first four bits, which include Least Significant Bits (LSBs). DAC 100 applies an active charge-sharing operation to the middle four bits and another active charge-sharing operation to the four Most Significant Bits (MSBs). The cycles are shown below in Table 1, where each cycle includes a sampling phase and a charge-sharing phase.

TABLE 1

| Phase 1 | Phase 2 | Phase 3 | Phase 4 | Phase 5 | Phase 6 |
|---------|---------|---------|---------|---------|---------|
| b0-b3 sampling | b0-b3 passive charge-sharing | b4-b7 sampling | b4-b7 active charge-sharing | b8-b11 sampling | b8-b11 active charge-sharing |

The embodiments described herein provide for twelve-bit, three-cycle operation. It should be noted that the scope of embodiments is not so limited; embodiments may be scaled to include any number of bits and any number of cycles. Furthermore, the embodiments described herein are not limited to a first passive charge-sharing cycle followed by active charge-sharing cycles. Various embodiments can be adapted to provide active and passive charge-sharing operations in any appropriate order.

Figure 2:
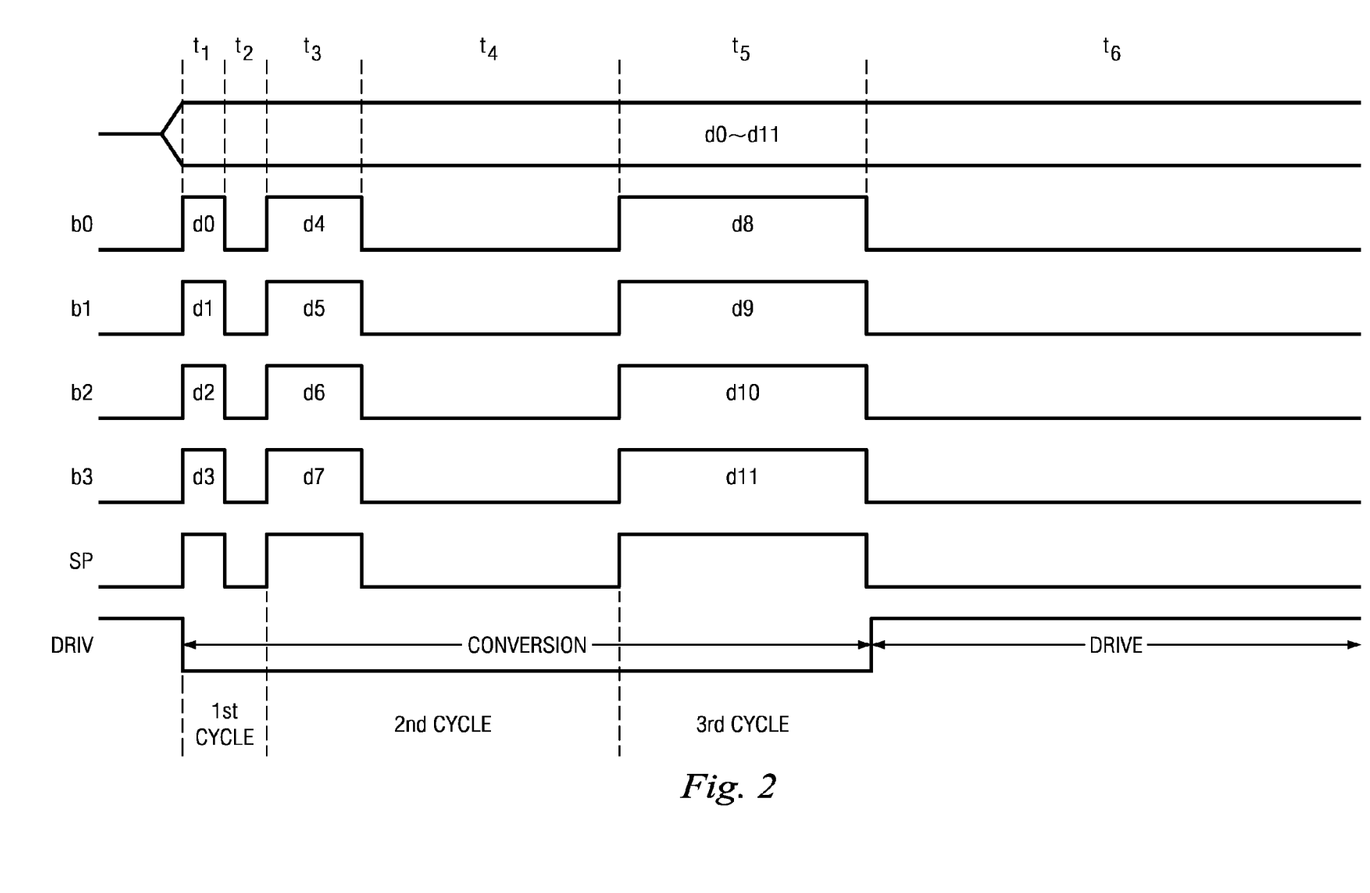
FIG. 2 shows an exemplary timing diagram for the three-cycles of the DAC of FIG. 1.

Furthermore, the time length of the first cycle (the passive charge-sharing cycle) is shorter than that of each of the two subsequent cycles. FIG. 2 shows an exemplary timing diagram for the three-cycles of DAC 100. During time period t1, sampling is performed on the four LSBs. In time period t2, the charge-sharing operation is performed for the four LSBs. Time periods t1 and t2 make up the first cycle.

Similarly, time periods t3 and t4 are sampling and charge-sharing, respectively, for the middle four bits. Time periods t5 and t6 include sampling and charge-sharing for the four MSBs. Of note is that each of the second and third cycles is longer than the first cycle. DAC 100 has an LSB cycle that uses passive charge-sharing with a relatively short period. The remaining time can be given to the two MSB cycles, which use active charge-sharing. Such an arrangement allows the MSB cycles more time to reach a high resolution without resorting to high power consumption. Thus, the MSBs are processed in a manner that provides adequate resolution at a reasonable power consumption level. High resolution is less critical for the LSBs and, thus, the size of the capacitor array can be kept small to use less die space despite a general preference in the art to employ large capacitor arrays for passive charging-sharing.

Even within the two MSB cycles, there is discrepancy between the time provided to the MSB cycle versus the cycle for the middle four bits. DAC 100 uses more time to convert the MSBs than it does to convert the middle four bits so as to provide higher accuracy to the MSBs.

FIGS. 3A-3F are circuit diagrams providing one example of how the binary control signals open and close the various switches to cause desired behavior in DAC 100. But first, a description of the binary control signals (and other signals) is helpful.

$V_L$, $V_H$ and $V_{CM}$: Three reference voltages for use with amplifier 120. $V_{CM}$ is a common mode voltage, and $V_L$ and $V_H$ are reference low and high, respectively. In the top left corner of FIG. 1, $V_L$ is shown as an input to capacitor array 110, which is a configuration applicable to NDACs. In PDAC embodiments, $V_H$ may be used as an input instead. In one 18V LCD driver embodiment, $V_{CM}$ is about 9V, $V_L$ is about 1V, and $V_H$ is about 17V, though other embodiments may differ. $V_L$ or $V_H$ may be referred to as $V_{ref}$ herein as well.

$V_{CH}$: Voltage at the capacitor CH.

$V_o$: Output voltage. Voltage at the output of amplifier 120.

OS: Offset cancellation. In some embodiments, amplifier 120 has a physical offset, and OS is used to cancel the offset by closing switches 116 (FIG. 1).

SP: Timing for serializer 130. SP' opens and closes switch 118.

RST: Reset. The Reset signal resets the value of capacitor array 110 by closing switch 117 (FIG. 1) before a subsequent twelve-bit number is converted.

CS_P: Charge-sharing passive. Closes switches 113 (FIG. 1) during a passive charge-sharing operation.

CS_A: Charge-sharing active. Closes switches 114 (FIG. 1) during an active charge-sharing operation.

DRIV: Drive. Closes switch 115 (FIG. 1) at the output of amplifier 120, thereby allowing the analog signal to be output to another component (not shown).

Figure 3A:
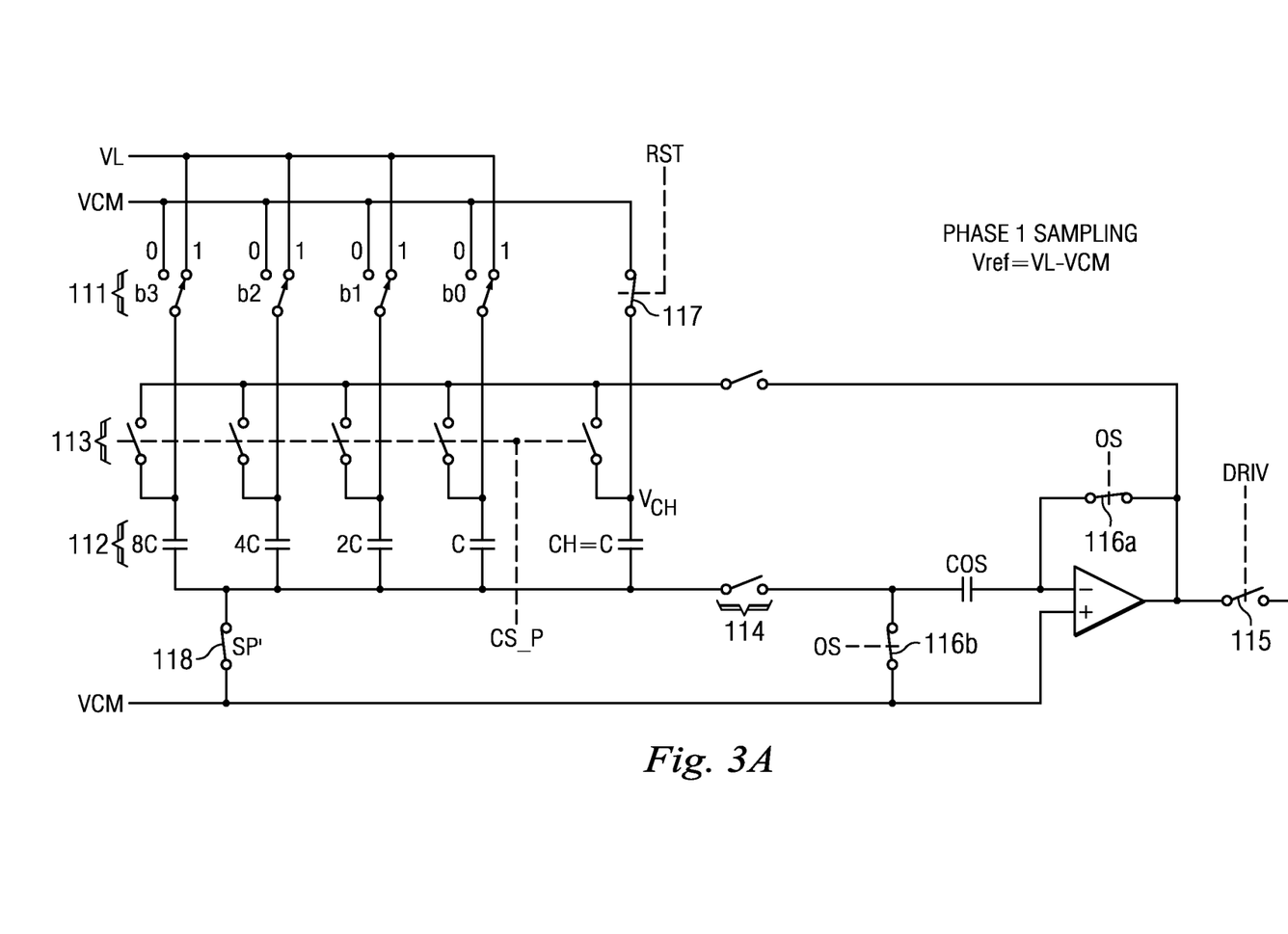
FIGS. 3A-3F are circuit diagrams providing one example of how binary control signals open and close various switches to cause desired behavior in the DAC of FIG. 1.

Returning to the discussion of FIG. 3A, the operation of DAC 100 during phase 1 is shown. The signals on the channels (b0-b3) control whether $V_{CM}$ or $V_L$ is applied to respective capacitors 112. In the present example, and in FIGS. 3C and 3E as well, the signals on b0-b3 are all ones for convenience of illustration, though it is understood that the signals on b0-b3 can include any combination of ones and zeros. In FIG. 3A, DAC 100 samples the four LSBs.

Switches 113 are all open during phase 1 and other sampling phases. Switches 114 are open and remain open during the entire passive charge-sharing cycle. Switch 115 remains open until it is time to output the analog value to another component in phase 6. Switches 116 are closed during phase 1 and other sampling phases to cancel the offset from the amplifier. Switch 117 is closed at the beginning of the first cycle to reset the value of capacitor CH and is open in subsequent cycles. Switch 118 is closed, as it is in the other sampling phases too.

Figure 3B:
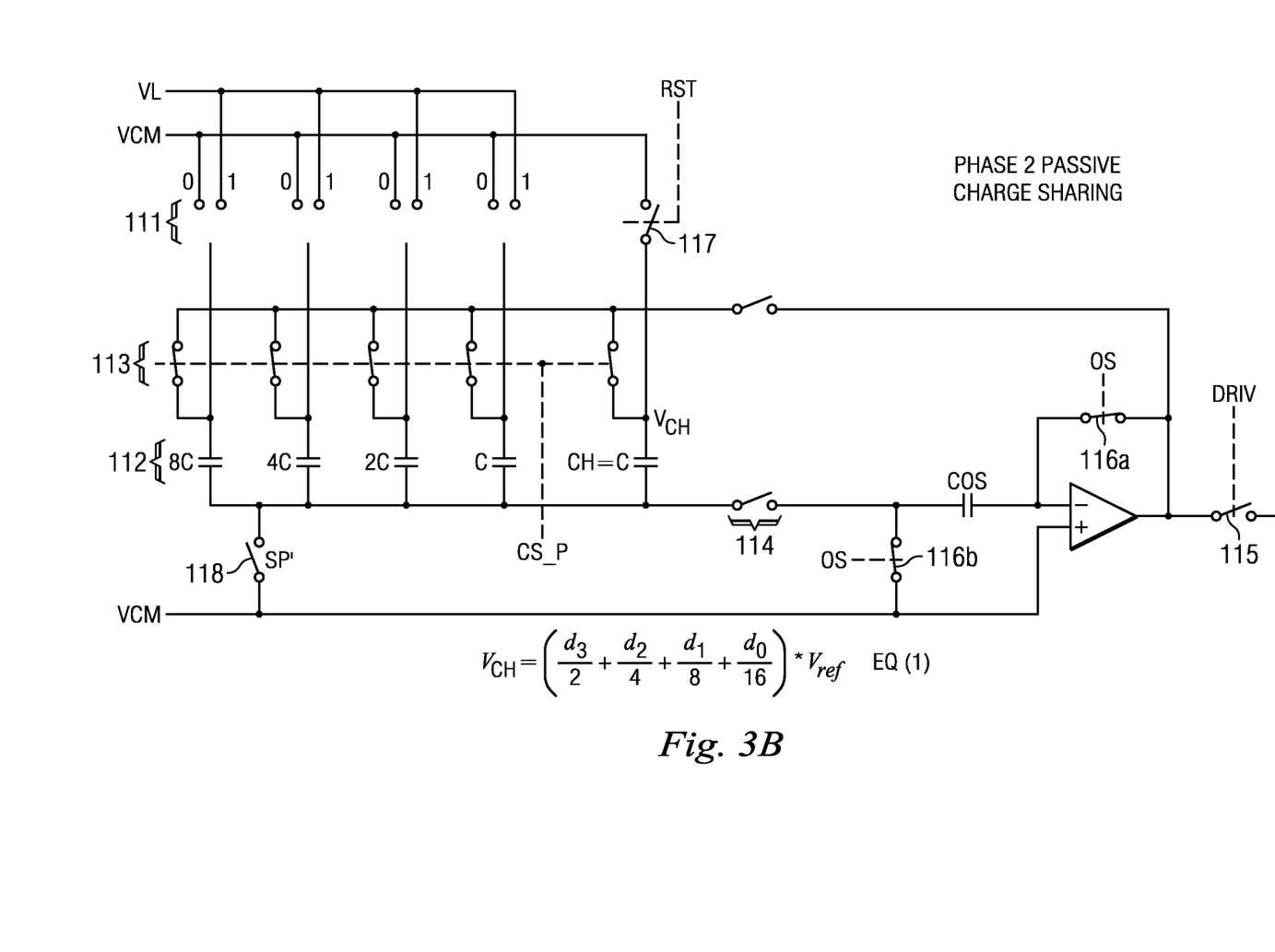

FIG. 3B shows the operation of DAC 100 during phase 2, which is the passive charge-sharing-phase. Switches 113 are closed to charge capacitors 112. Also, there is no input at switches 111 during charge-sharing. FIG. 3B shows Equation (1), which gives a value for the charge on capacitor CH.

Figure 3C:
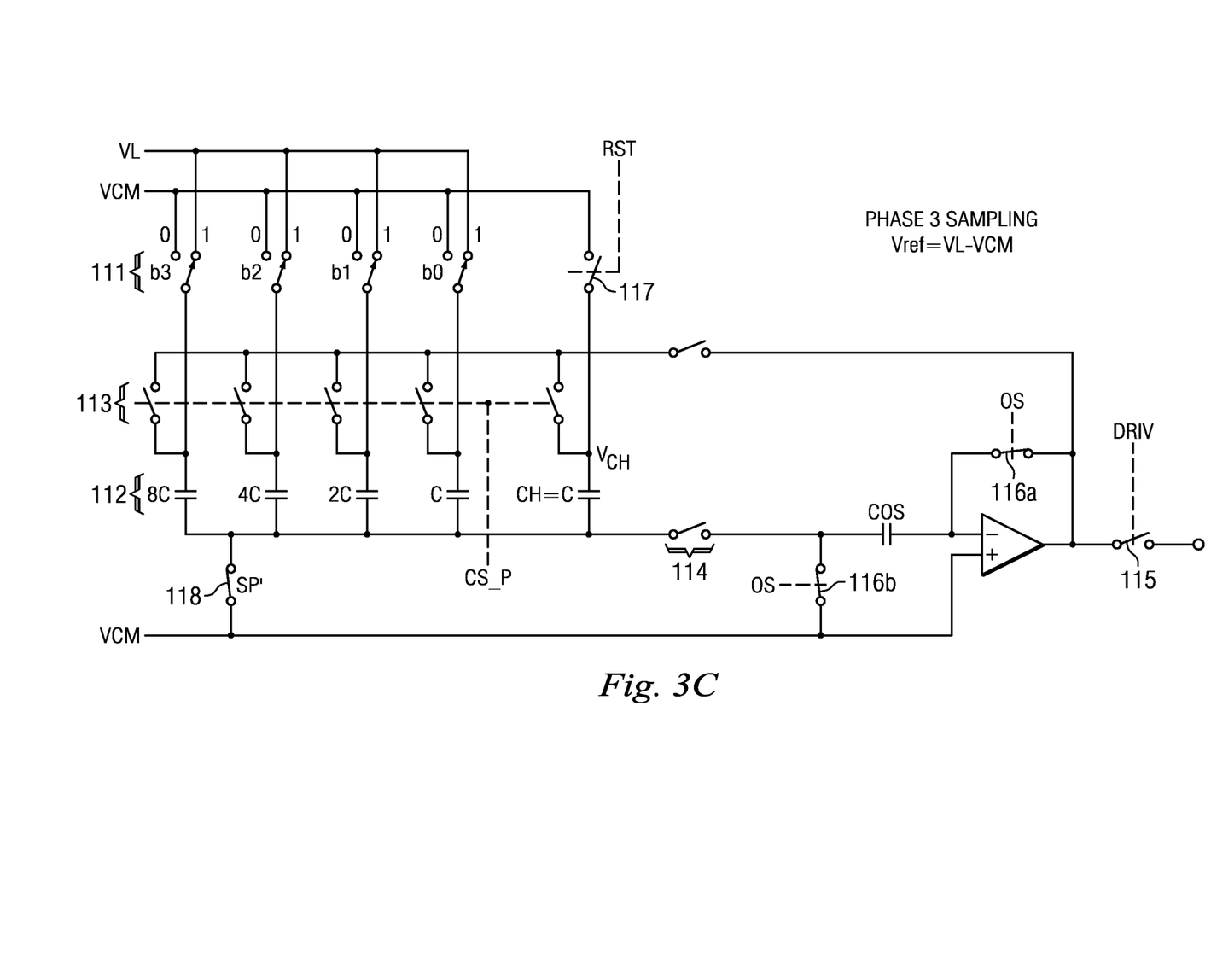

FIG. 3C shows the operation of DAC 100 during phase 3, which is the sampling phase for the middle four bits. The operation of DAC 100 during phase 3 is similar to the operation of DAC 100 during phase 1.

Figure 3D:
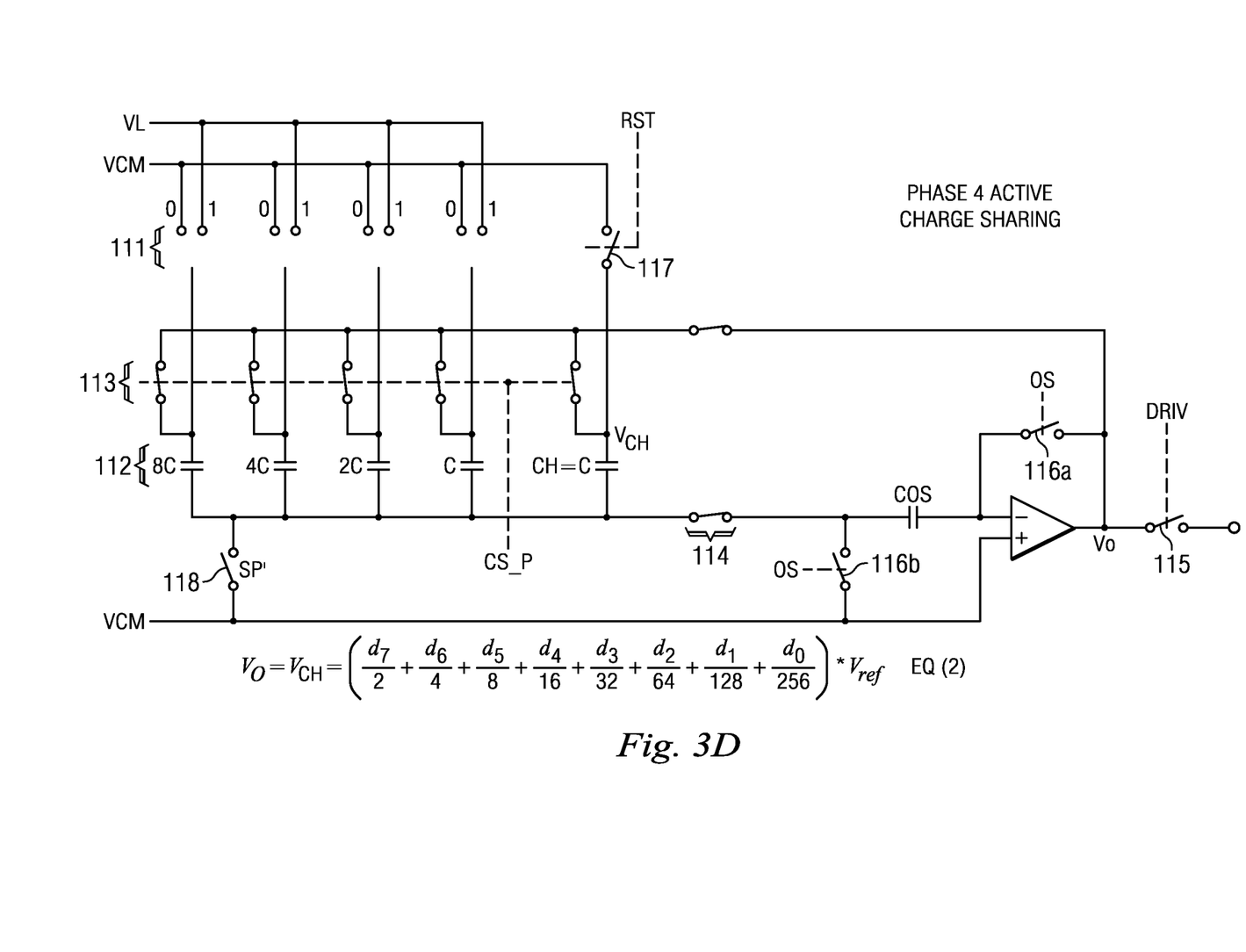

FIG. 3D shows the operation of DAC 100 during phase 4, which is the active charge-sharing phase for the middle four bits. As in passive charge-sharing, switches 113 are closed, but additionally, switches 114 are closed during active charge-sharing operations. When switches 114 are closed, the op-amp in amplifier 120 experiences negative feedback. Switches 116 are open during active charge-sharing. Equation (2) in FIG. 3D gives the new value for $V_{CH}$, which is the same as the value for $V_o$.

Figure 3E:
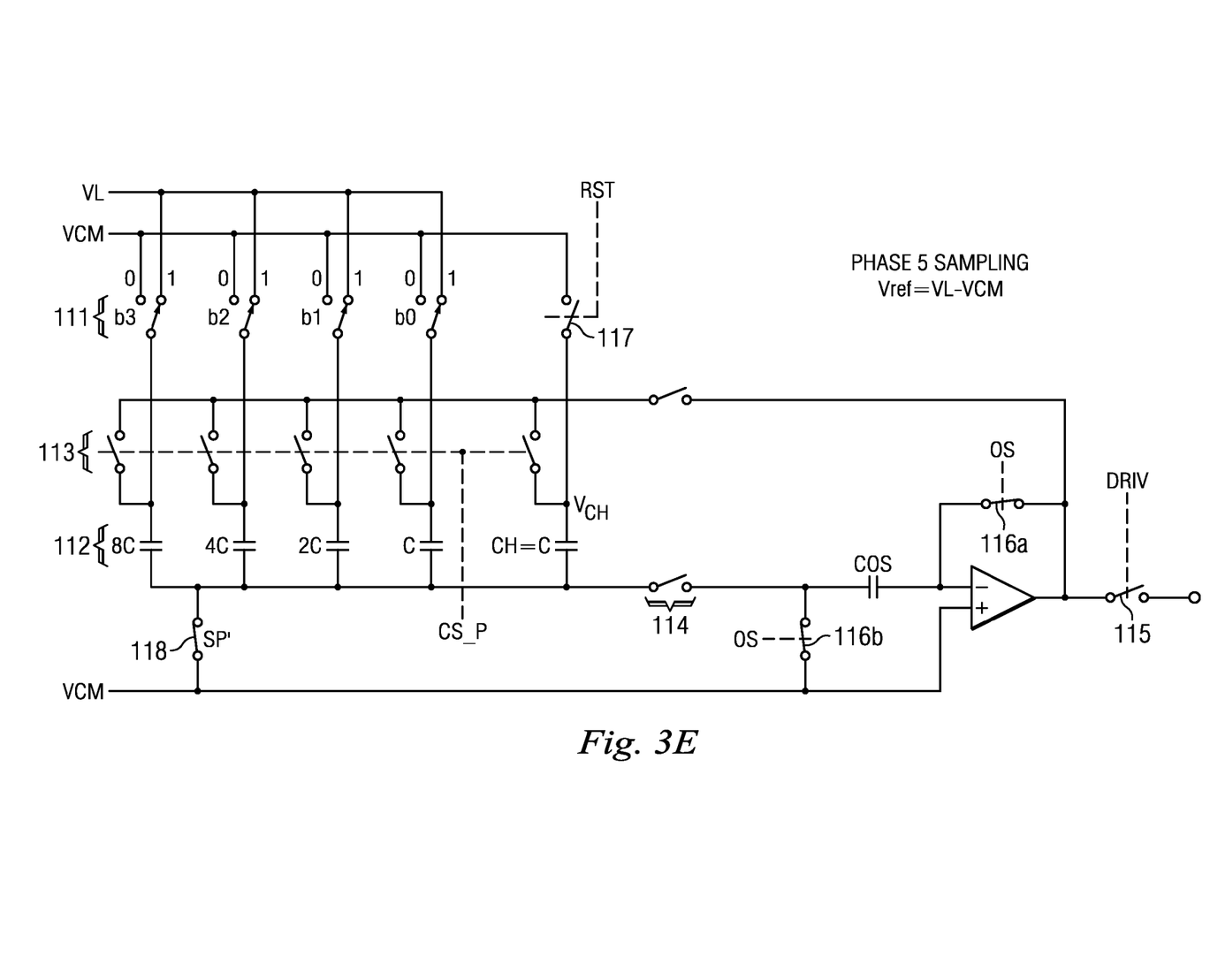

FIG. 3E shows the operation of DAC 100 during phase 5, which is the sampling phase for the four MSBs. DAC 100 behaves similarly in phase 5 as it does in phases 1 and 3.

Figure 3F:
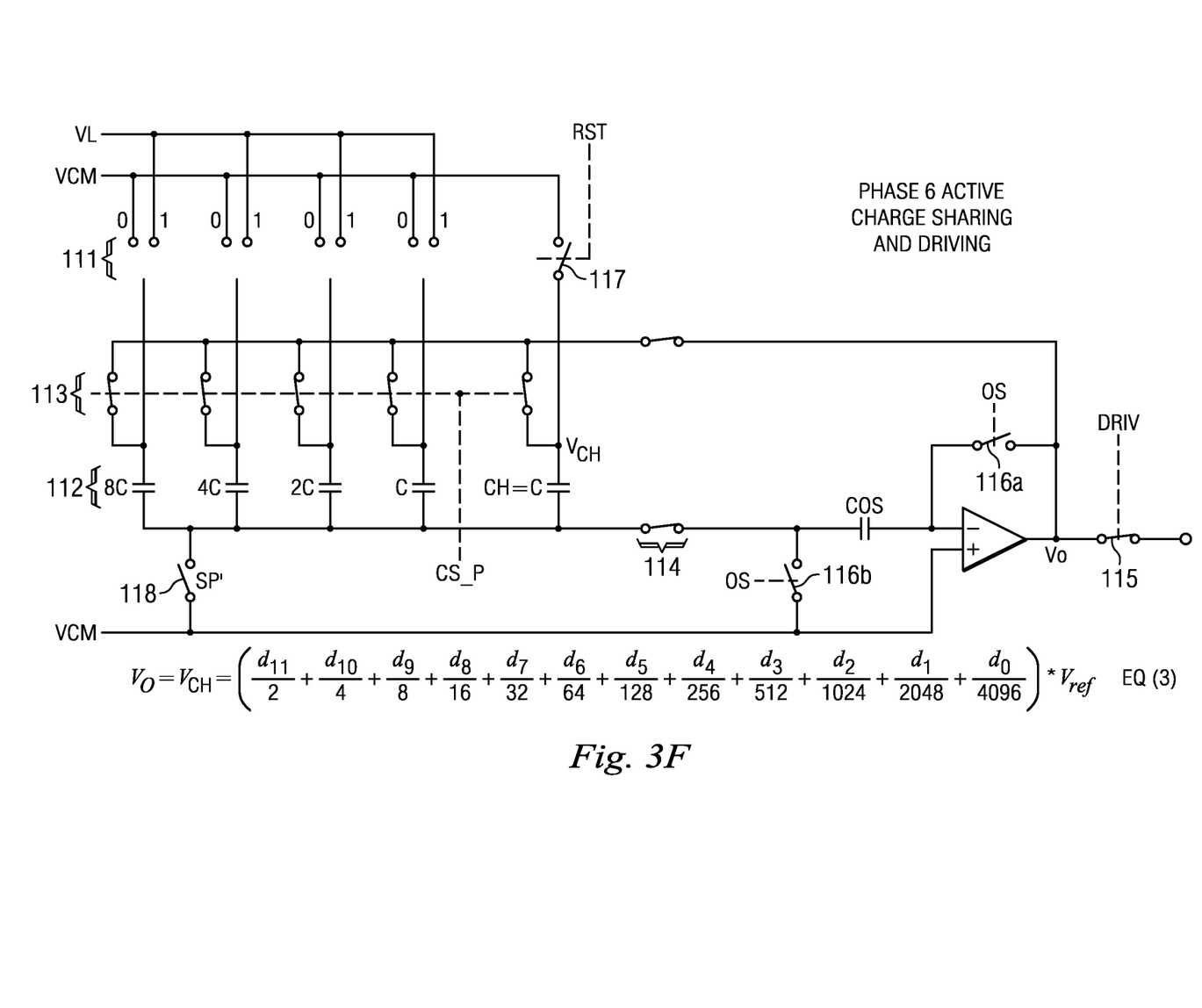

FIG. 3F shows the operation of DAC 100 during active charge-sharing for the four MSBs and during driving as well. As in phase 4, switches 113 and switches 114 are closed and switches 116 are open to provide the negative feedback. Equation (3) gives the value of $V_o$ during phase 6. Switch 115 is then closed to drive $V_o$ to another component (not shown) such as a column in an LCD panel. The voltage signal that is output at switch 115 is an analog signal that corresponds to the twelve-bit digital number that was input to serializer 130

(FIG. 1). In many embodiments, phase 6 is followed by a phase 1 for a subsequent twelve-bit number.

Figure 4:
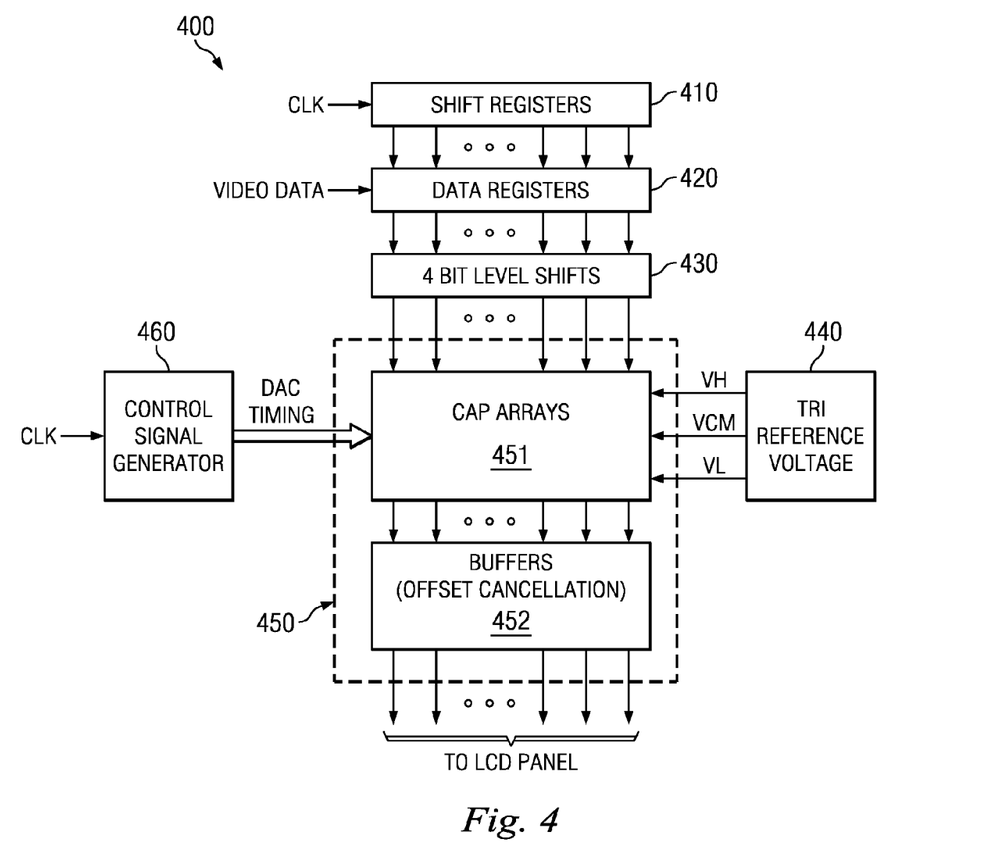
FIG. 4 is an illustration of an exemplary system for use in providing analog video signals to a LCD panel.

FIG. 4 is an illustration of system 400 for use in providing analog video signals to an LCD panel. System 400 includes shift registers 410 and data registers 420. Data registers 420 receive digital video data and shift it to the 4-bit level shifts 430. Registers 410, 420 and level shifts 430 are part of data serializer 130 (FIG. 1).

C-DACs 450 include a multitude of DACs the same as or similar to DAC 100 (FIG. 1). In one example, C-DACs 450 include one DAC for every column of the LCD, though various embodiments may differ. Each of the DACs includes a capacitor array and a buffer (e.g., an op-amp). Such items are shown collectively as capacitor arrays 451 and buffers 452.

C-DACs 450 receive control signals from control signal generator 460, which in this example is the same as or similar to control signal generator 140 (FIG. 1). C-DACs 450 receive reference voltages from reference voltage block 440. The analog signals output from C-DACs 450 are driven to the pixels in the LCD panel (not shown).

Figure 5:
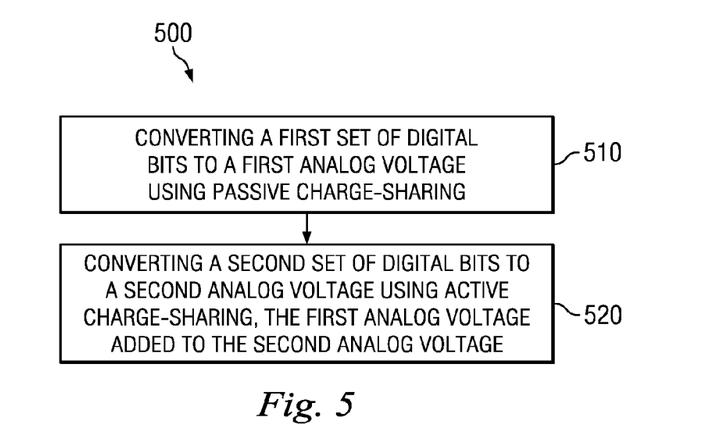
FIG. 5 is an illustration of an exemplary method according to one embodiment for converting digital signals to analog signals.

FIG. 5 is an illustration of exemplary method 500 according to one embodiment. Method 500 may be performed, for example, by system 100 of FIG. 1 as it converts video data into analog signals and drives the analog signals to another component, such as a buffer or LCD panel.

In block 510, a first set of digital bits are converted to a first analog voltage using passive charge-sharing. For example, FIGS. 3A and 3B show a conversion operation that includes sampling the digital bits and a passive charge-sharing operation to convert the digital bits to an analog voltage. The analog voltage is shown by Equation 1 in FIG. 3B.

In block 520, a second set of digital bits are converted to a second analog voltage using active charge-sharing. For instance, FIGS. 3C and 3D show an operation that includes sampling the digital bits and an active charge-sharing technique to convert the digital bits to an analog voltage that is added to the first analog voltage. The added analog voltages are shown by Equation 2 in FIG. 3D. In some embodiments, the time for performing block 510 may be substantially less than the time for performing block 520.

The scope of embodiments is not limited to the actions described above with respect to blocks 510 and 520. Other embodiments may add, omit, rearrange, or modify actions as appropriate. For instance, in another embodiment, the MSBs are converted using active charge-sharing before the LSBs are converted using passive charge-sharing. In another example embodiment, more conversion cycles are performed and add voltages to the first and second voltages before the summed voltage is driven as output. Method 500 can be performed numerous times in repetition, for instance at 60 Hz or other speed, according to the characteristics of the application to which the method is adapted.

Various embodiments may include advantages over other techniques. For example, some embodiments may use a capacitor array that is relatively small compared to capacitor arrays used in conventional passive charge-sharing devices. Specifically, by performing passive charge-sharing for LSBs only, some embodiments limit the total amount of error that can be caused by the passive charge-sharing operation. Thus, any decreased accuracy attributable to the use of small capacitor arrays is small. Furthermore, various embodiments save time by using the passive charge-sharing operation and apply that saved time to the remaining cycles that use active charge-sharing on more significant bits. Active charge-sharing cycles can have increased power efficiency when they are allowed extra time. Therefore, various embodiments enjoy 1) a relatively small capacitor array, 2) moderate power consumption, and 3) reliable accuracy in resolution, notwithstanding 1) and 2).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for converting a multi-bit digital value to an analog value using a Digital to Analog Converter (DAC) comprising a switched capacitor array, an amplifier, and at least one switch connected between the switched capacitor array and the amplifier, the method comprising:
   in a first conversion cycle, converting a first set of digital bits to a first analog voltage using passive charge-sharing, wherein during the first conversion cycle the at least one switch is open to disconnect the amplifier from the switched capacitor array; and
   in a second conversion cycle, converting a second set of digital bits to a second analog voltage added to the first analog voltage using active charge-sharing, wherein during the second conversion cycle the at least one switch is closed to connect the amplifier to the switched capacitor array in a feedback configuration, wherein the first set of digital bits and the second set of digital bits are different bits of the multi-bit digital value, wherein the first set of digital bits comprises bits of lesser significance than the second set of digital bits, and wherein the second conversion cycle occurs after the first conversion cycle.

2. The method of claim 1 in which the first and second sets of digital bits are of the same length.

3. The method of claim 2 in which the first conversion cycle and the second conversion cycle have respective time periods of different lengths.

4. The method of claim 2 in which the first conversion cycle has a shorter time period than a time period of the second conversion cycle.

5. The method of claim 1 performed by a cyclic capacitor Digital to Analog Converter (DAC).

6. The method of claim 1 further comprising:
   driving the analog value from a circuit output to a pixel in a Liquid Crystal Display (LCD) system, the analog value comprising the first and second analog voltages.

7. The method of claim 1 in which each of the first conversion cycle and the second conversion cycle comprises:
   a sampling phase; and
   a charge-sharing phase.

8. The method of claim 1, further comprising:
   in a third conversion cycle, converting a third set of digital bits to a third analog voltage added to the first analog voltage and the second analog voltage using active charge-sharing, wherein the first, second, and third sets of digital bits are different bits of the multi-bit digital value.

9. A Digital to Analog Converter (DAC) comprising:
   a switched capacitor array with an input that receives serialized digital bits;
   an amplifier;

at least one switch connected between the switched capacitor array and the amplifier; and a control signal generator generating pulse-width control signals to control the switched capacitor array and the amplifier to assume one of two modes, the modes including a passive charge-sharing mode for a first conversion cycle and an active charge-sharing mode for a second conversion cycle, wherein the control signal generator controls the switched capacitor array and the amplifier to assume the passive charge-sharing mode for ones of the serialized digital bits of a lesser significance and to assume the active charge-sharing mode for ones of the serialized digital bits of more significance, wherein in the passive charge-sharing mode the at least one switch is open to disconnect the switched capacitor array from the amplifier, wherein in the active charge-sharing mode the at least one switch is closed to connect the switched capacitor array and the amplifier in a feedback configuration, wherein the second conversion cycle occurs after the first conversion cycle, and wherein the serialized digital bits are converted from digital to analog during the first and second conversion cycles.

10. The DAC of claim 9 further comprising:
a driving switch between an output of the amplifier and an output of the DAC.

11. The DAC of claim 9 further comprising:
a data serializer that receives a digital value of a first number of bits and outputs the serialized digital bits on a plurality of channels, wherein a number of the channels is less than the first number of bits.

12. The DAC of claim 9 in which the control signal generator controls each of the modes to have a sampling phase and a charge-sharing phase.

13. The DAC of claim 9 in which the control signal generator controls the switched capacitor array and the amplifier so that the passive charge-sharing mode is shorter in time than is the active charge-sharing mode.

14. The DAC of claim 9 included in a column driver of a Liquid Crystal Display (LCD) panel.

15. A Liquid Crystal Display (LCD) panel comprising:
an array of Digital to Analog Converters (DACs) receiving digital video data, converting the digital video data to analog signals, and driving pixels within the LCD panel using the analog signals, each of the DACs comprising:
an array of capacitors;
an amplifier; and
at least one switch connected between the amplifier and the array of capacitors;
a control signal generator producing binary control signals to control the array of capacitors and the amplifier to perform a first conversion cycle using passive charge-sharing and a second conversion cycle using active charge-sharing, wherein the at least one switch is open to disconnect the array of capacitors from the amplifier during passive charge sharing, wherein the at least one switch is closed to connect the amplifier to the array of capacitors in a feedback configuration during active charge sharing, wherein the control signal generator controls the DACs to perform passive charge-sharing on least significant bits and active charge-sharing on most significant bits, wherein the second conversion cycle occurs after the first conversion cycle, and wherein the digital video data are converted to analog during the first and second conversion cycles.

16. The LCD panel of claim 15 in which the control signal generator controls the array of capacitors and the amplifier so that the first conversion cycle is shorter in time than is the second conversion cycle.

17. The LCD panel of claim 15 further comprising a serializer that receives the digital video data and outputs serialized data on a plurality of channels to the array of capacitors.

* * * * *